US012782453B2

(12) United States Patent
Kato

(10) Patent No.: US 12,782,453 B2
(45) Date of Patent: Nov. 3, 2026

(54) BATTERY MONITORING DEVICE AND BATTERY MONITORING SYSTEM

(71) Applicant: Nuvoton Technology Corporation Japan, Kyoto (JP)

(72) Inventor: Takumi Kato, Kyoto (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 239 days.

(21) Appl. No.: 18/823,235

(22) Filed: Sep. 3, 2024

(65) Prior Publication Data

US 2024/0426930 A1 Dec. 26, 2024

Related U.S. Application Data

(63) Continuation of application No. PCT/JP2023/006817, filed on Feb. 24, 2023.

(30) Foreign Application Priority Data

Mar. 8, 2022 (JP) ................................ 2022-035066

(51) Int. Cl.
*G01R 31/389* (2019.01)
*G01R 31/374* (2019.01)

(52) U.S. Cl.
CPC ......... *G01R 31/389* (2019.01); *G01R 31/374* (2019.01)

(58) Field of Classification Search
CPC ............................ G01R 31/389; G01R 31/374
See application file for complete search history.

(56) References Cited

U.S. PATENT DOCUMENTS

2020/0256924 A1 8/2020 Hoermaier et al.
2021/0109160 A1* 4/2021 Matsukawa ........ G01R 31/3842
2021/0223327 A1* 7/2021 Berger ................. G01R 31/396
2022/0163592 A1* 5/2022 Barsukov ........... G01R 31/3842
2022/0260642 A1* 8/2022 Sestok, IV ........... G01R 31/389
2024/0027533 A1* 1/2024 Loopik ................ G01R 31/385

FOREIGN PATENT DOCUMENTS

JP 02-287163 B2 11/1990
JP 5924516 B2 5/2016
WO 2017/061036 A1 4/2017

OTHER PUBLICATIONS

International Search Report dated Apr. 18, 2023 issued in International Patent Application No. PCT/JP2023/006817, with English translation.

* cited by examiner

*Primary Examiner* — Walter L Lindsay, Jr.
*Assistant Examiner* — Milton Gonzalez
(74) *Attorney, Agent, or Firm* — Rimon P.C.

(57) ABSTRACT

A battery monitoring device includes: a reference resistor connected to a cell stack in series; a measurement calculation unit (a voltage measurement unit, a current measurement unit, and an impedance calculation unit) configured to measure impedance of each of cells in the cell stack and impedance of the reference resistor; and a calibration unit configured to correct a gain and a phase of the impedance of each of the cells that has been measured, using the impedance of the reference resistor that has been measured.

8 Claims, 4 Drawing Sheets

BATTERY MONITORING DEVICE AND BATTERY MONITORING SYSTEM

CROSS REFERENCE TO RELATED APPLICATIONS

This is a continuation application of PCT International Application No. PCT/JP2023/006817 filed on Feb. 24, 2023, designating the United States of America, which is based on and claims priority of Japanese Patent Application No. 2022-035066 filed on Mar. 8, 2022. The entire disclosures of the above-identified applications, including the specifications, drawings and claims are incorporated herein by reference in their entirety.

FIELD

The present disclosure relates to a battery monitoring device and a battery monitoring system (also referred to as a battery management system (BMS)) that monitor a battery such as a cell stack in which cells such as lithium-ion cells are connected in series.

BACKGROUND

In recent years, applications that use secondary cells, such as storage batteries for stably supplying renewable energy as well as environment-friendly vehicles including electric vehicles, have been increasing rapidly. In many cases, lithium-ion cells (also referred to as lithium-ion batteries (LiBs)) are used as secondary cells for their high energy density. Since lithium-ion cells are known for accelerating their degradation due to overcharge, overdischarge, and temperature, and the cells may reach a dangerous state such as smoking and ignition and even an explosion in worst cases, such lithium-ion cells are normally incorporated into a BMS and placed under appropriate control.

Recently, a suggestion is made to directly measure the inner state of a battery to detect degradation or inner temperature of the battery and enhance the accuracy of battery control. PTL 1 suggests employing an alternating current (AC) impedance method for measuring the impedance of a battery by measuring voltage and current while causing the battery to sweep an AC signal. Impedance is a complex number including a real number and an imaginary number.

CITATION LIST

Patent Literature

PTL 1: Japanese Patent No. 5924516

SUMMARY

Technical Problem

The present disclosure provides a battery monitoring device and a battery monitoring system capable of measuring the impedance of a battery with accuracy.

Solution to Problem

A battery monitoring device according to one aspect of the present disclosure monitors a battery, and includes: a reference resistor connected to the battery in series; a measurement calculation unit configured to measure impedance of the battery and impedance of the reference resistor; and a calibration unit configured to correct a gain and a phase of the impedance of the battery that has been measured, using the impedance of the reference resistor that has been measured.

Moreover, a battery monitoring system according to one aspect of the present disclosure includes a battery and the battery monitoring device that monitors the battery.

Advantageous Effects

With the battery monitoring device and battery monitoring system according to the present disclosure, the impedance of a battery is measured with accuracy.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS (Knowledge Forming the Basis of the Present Disclosure)

With the impedance measurement method proposed in PTL 1, the following measurement error is conceivable. A phase shift between a cell voltage and current is generated due to the wiring system between each cell and a current sensor, and an impedance measurement error occurs. More specifically, with the technique disclosed in PTL 1, depending on a position at which current is measured, true current that flows through the battery is not measured and current after the occurrence of the phase shift due to the wiring system is measured, and impedance with error may be calculated using current that caused such a phase shift.

Figure 1:
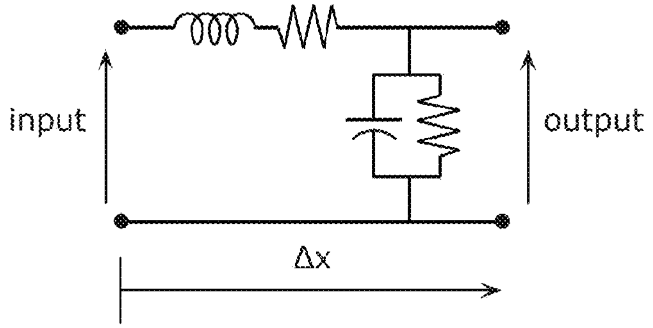
FIG. 1 is a diagram illustrating the equivalent circuit of a general distributed constant circuit.
Figure 2:
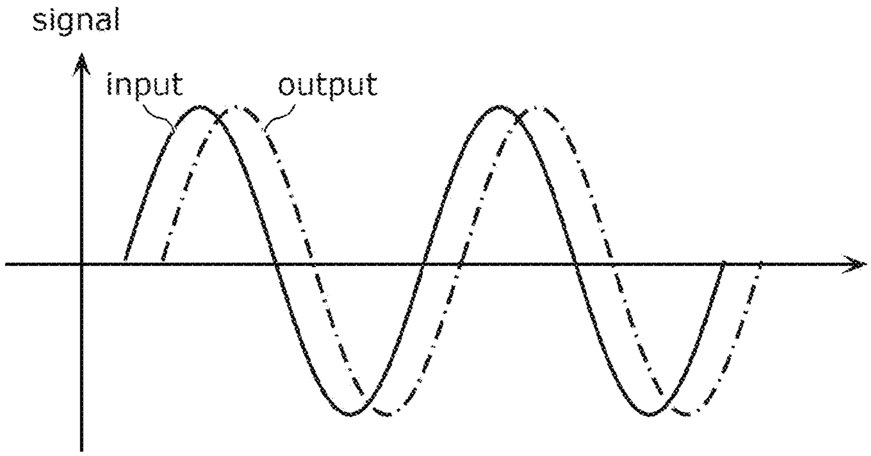
FIG. 2 is a diagram illustrating a signal phase delay with respect to the general distributed constant circuit in FIG. 1.
Figure 3:
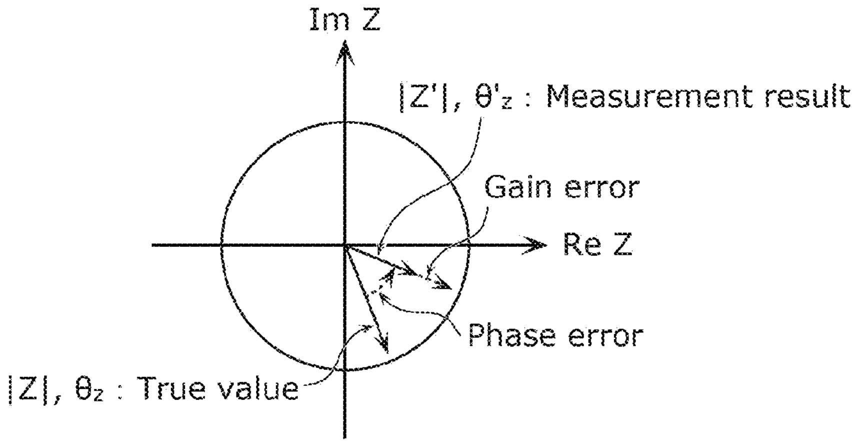
FIG. 3 is a vector diagram illustrating the phase error and gain error of impedance with respect to a signal delay in FIG. 2.

In general, a connection wiring system with length $\Delta x$ can be expressed using a distributed constant circuit as in FIG. 1, and the phase shift of a transmission signal caused by the connection wiring system as in FIG. 2 (i.e., the phase difference between input and output of the connection wiring system) is caused. Accordingly, a phase shift equivalent to the wiring length of the connection wiring system between current measurement and voltage measurement occurs between the two measurements, and the phase error and gain error of impedance occur from a true value in the measurement result, as illustrated in FIG. 3.

In view of this, the inventors have come to conceive a battery monitoring device and a battery monitoring system capable of measuring the impedance of a battery with accuracy.

Hereinafter, embodiments of the present disclosure will be described in detail with reference to the drawings. The embodiments described below each illustrate one specific example of the present disclosure. The numerical values, shapes, materials, elements, the arrangement and connection of the elements, steps, order of the steps, etc., shown in the following embodiments are mere examples, and therefore do not intend to limit the present disclosure. The figures are not necessarily precise illustrations. Elements that are essentially the same share the same reference signs in the figures, and duplicate description is omitted or simplified. The term “connection” means an electric connection and includes not only a case where two circuit elements are directly connected, but also a case where two circuit elements are indirectly connected while other circuit elements are inserted between the two circuit elements.

Embodiment 1

Figure 4:
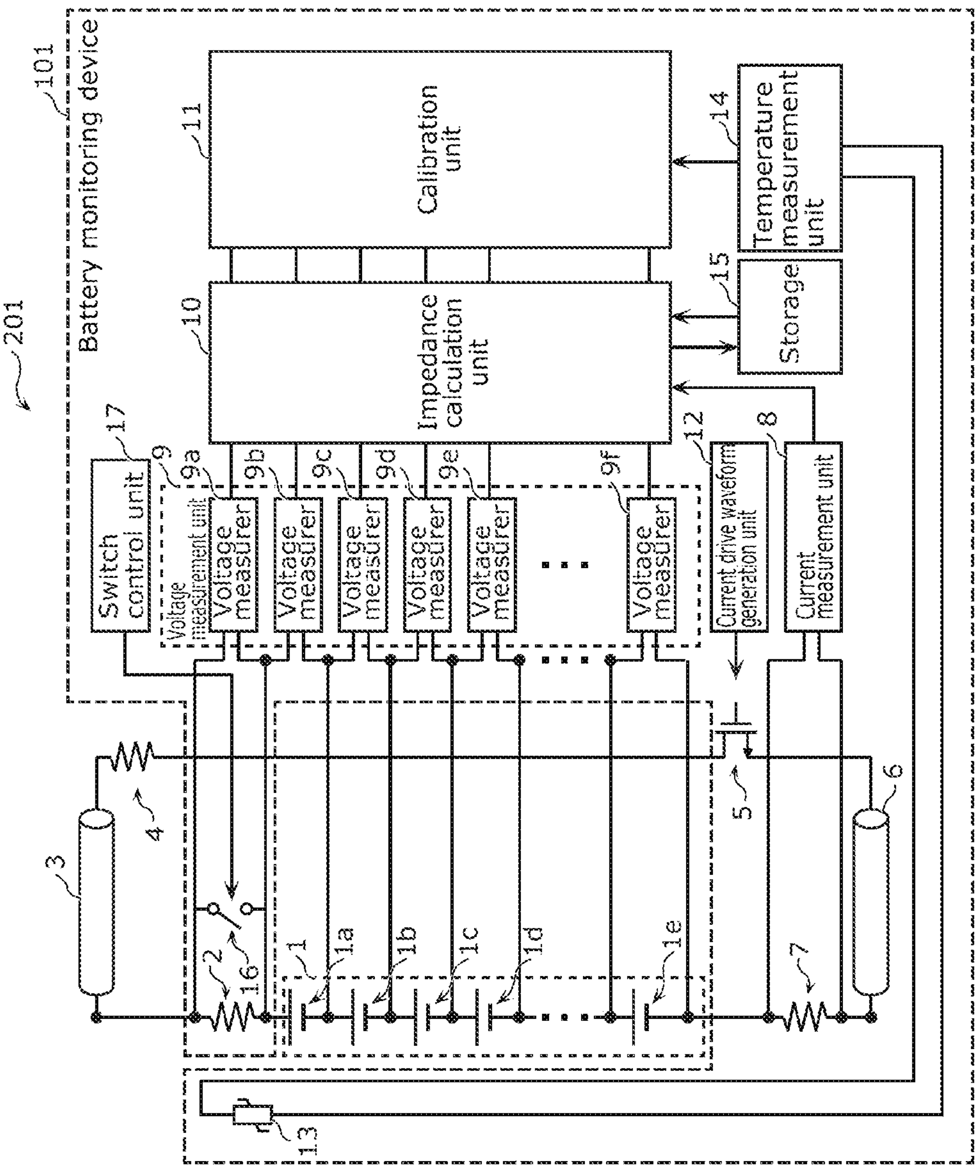
FIG. 4 is a block diagram illustrating the configuration of a battery monitoring system according to Embodiment 1.

FIG. 4 is a block diagram illustrating the configuration of battery monitoring system 201 according to Embodiment 1. FIG. 4 illustrates cell stack 1 that is a monitoring target, load resistor 4 of power supplied from cell stack 1, first transmission line 3 and second transmission line 6 for transmitting the power, and battery monitoring device 101. A combination of cell stack 1 and battery monitoring device 101 is referred to as battery monitoring system 201. For the sake of convenience, second transmission line 6 is illustrated within a dotted line indicating battery monitoring device 101 in FIG. 4, but is a component outside battery monitoring device 101. However, first transmission line 3, second transmission line 6, and load resistor 4 may configure battery monitoring device 101.

Cell stack 1 is configured by connecting, in series, cells 1*a* to 1*e* that are batteries. In the present embodiment, cells 1*a* to 1*e* are lithium-ion cells, but may be other cells such as nickel metal hydride cells.

Battery monitoring device 101 includes reference resistor 2, shunt resistor 7, through switch 16, switching element 5, thermistor 13, switch control unit 17, voltage measurement unit 9, current drive waveform generation unit 12, current measurement unit 8, impedance calculation unit 10, storage 15, calibration unit 11, and temperature measurement unit 14. First transmission line 3 is a wire that connects reference resistor 2 and load resistor 4, and second transmission line 6 is a wire that connects switching element 5 and shunt resistor 7.

Reference resistor 2 is a resistive element for reference. In the present embodiment, reference resistor 2 is disposed near cell stack 1 and is connected between first transmission line 3 and the positive terminal of cell 1*a* that is the highest cell in cell stack 1.

Through switch 16 is a switch that is connected to reference resistor 2 in parallel, and in accordance with a control signal from switch control unit 17, switches between the state of short-circuiting (i.e., bypassing) both ends of reference resistor 2 by turning ON and the state of allowing current to flow through reference resistor 2 by turning OFF.

Switching element 5 is an element that allows an AC current to flow through cell stack 1 by repeating turning ON and OFF in accordance with an AC signal output from current drive waveform generation unit 12, and is, for example, a MOS transistor.

Switch control unit 17 is a control signal generation circuit that transmits a control signal that causes through switch 16 to turn ON or OFF to through switch 16.

Voltage measurement unit 9 is an assembly of voltage measurer 9*a* that measures voltages at both ends of reference resistor 2 and voltage measurers 9*b* to 9*f* each of which measures voltages at both ends of a corresponding one of cells 1*a* to 1*e* included in cell stack 1, and is configured by, for example, an A/D converter or the like.

Current drive waveform generation unit 12 is a control signal generation circuit that transmits, to switching element 5, an AC signal at any predetermined frequency for causing switching element 5 to repeat turning ON and OFF.

Current measurement unit 8 measures the voltage fall of shunt resistor 7 to measure current that flows through shunt resistor 7, and is configured by, for example, an A/D converter or the like.

Storage 15 is memory and is used to store the impedance of reference resistor 2 that has previously been measured or to pre-store known reference resistor impedance. Known reference resistor impedance is ideal impedance for reference resistor 2 that is obtained through measurement at the predetermined frequency mentioned above and a predetermined temperature (e.g., 25 degrees Celsius) under ideal measurement conditions, and is impedance obtained by, for example, measuring, in advance, only reference resistor 2 using an impedance measurer.

Impedance calculation unit 10 divides an AC voltage measured using voltage measurement unit 9 by an AC current measured using current measurement unit 8, to calculate the impedance of reference resistor 2 and the impedance of each of cells 1*a* to 1*e*, or store the calculated impedance of reference resistor 2 in storage 15 and refer to the calculated impedance of reference resistor 2 in storage 15, or refer to known reference resistor impedances stored in storage 15.

Thermistor 13 is disposed in proximity to reference resistor 2 and is a sensor for monitoring the temperature of reference resistor 2. Since reference resistor 2 is disposed near cell stack 1, the temperature of reference resistor 2 detected by thermistor 13 is close to the temperature of cell stack 1 or the temperature of an environment in which cell stack 1 is placed.

Temperature measurement unit 14 measures the resistance value of thermistor 13 to measure the temperature of reference resistor 2.

Calibration unit 11 performs temperature correction on the impedance of known reference resistor impedance obtained from storage 15 via impedance calculation unit 10, using the temperature of reference resistor 2 measured by temperature measurement unit 14, and corrects the gain and phase of the measured impedance of the battery using the known reference resistor impedance after temperature correction and the impedance of reference resistor 2 calculated by impedance calculation unit 10. In other words, calibration unit 11 calculates the gain error and phase error of the impedance of reference resistor 2 calculated by impedance calculation unit 10, using the known reference resistor impedance after temperature correction as a reference, and corrects the gain and phase of the impedance of each of cells 1*a* to 1*e* calculated by impedance calculation unit 10, using the gain error and the phase error that have been obtained.

Voltage measurement unit 9, current measurement unit 8, and impedance calculation unit 10 configure a measurement calculation unit that measures the impedance of each of cells 1*a* to 1*e* and the impedance of reference resistor 2. Such measurement calculation unit and calibration unit 11 are each realized by, for instance, an A/D converter, a digital signal processor (DSP) in which a program is installed, or the like.

In the present embodiment, battery monitoring device 101 is configured to measure the impedance of every one of cells 1*a* to 1*e* included in cell stack 1, but the battery monitoring device according to the present disclosure is not limited to have such a configuration.

The battery monitoring device may be configured to measure the impedance of only one of cells 1*a* to 1*e* or only series cells into which cells 1*a* to 1*e* are divided.

Next, the operation of battery monitoring device 101 according to the present embodiment which is configured as described above will be described.

Figure 5:
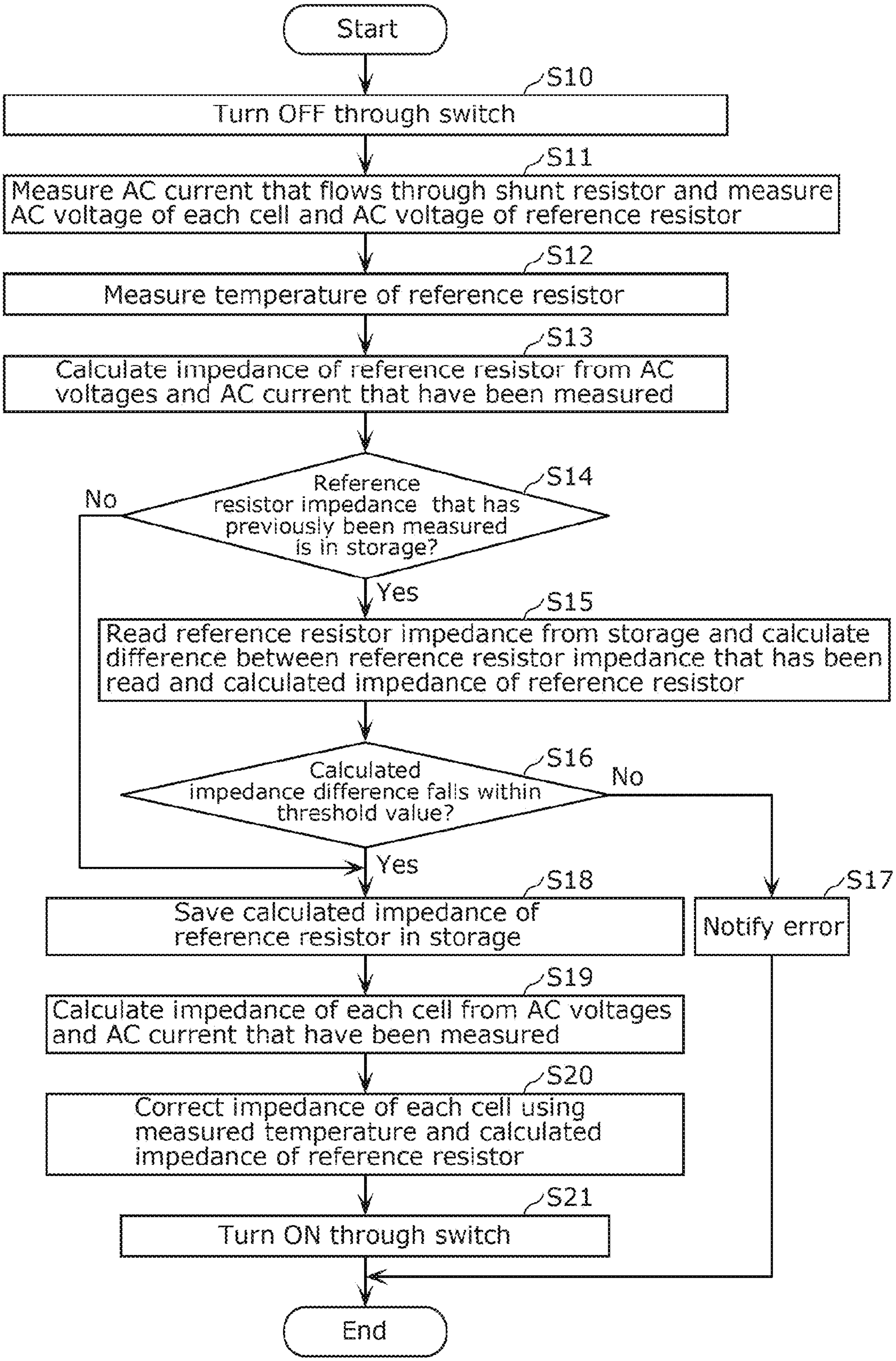
FIG. 5 is a flowchart illustrating the procedure of impedance measurement performed by a battery monitoring device according to Embodiment 1 or 2.

FIG. 5 is a flowchart illustrating the procedure of impedance measurement performed by battery monitoring device 101 according to Embodiment 1. A state before starting the impedance measurement is a state in which through switch 16 is controlled to be in ON-state by switch control unit 17, and as a result, reference resistor 2 is short-circuited.

First, switch control unit 17 turns OFF through switch 16 at the start of measurement (S10). Switch control unit 17 then sweeps an AC signal from current drive waveform generation unit 12, causes switching element 5 to turn ON and OFF to allow an AC current to flow through cell stack 1, and measures, using current measurement unit 8, an AC voltage generated in shunt resistor 7, to measure an AC current that flows through shunt resistor 7, and at the same time, measures the AC voltage of each of cells 1*a* to 1*e* and the AC voltage of reference resistor 2, using voltage measurement unit 9 (S11).

Subsequently, calibration unit 11 measures the temperature of reference resistor 2 using thermistor 13 and temperature measurement unit 14 (S12).

Impedance calculation unit 10 calculates the impedance of reference resistor 2 from the AC voltages measured by voltage measurement unit 9 and the AC current measured by current measurement unit 8 (S13). After the calculation, impedance calculation unit 10 determines whether reference resistor impedance that has previously been measured is in storage 15 (S14). When previously-measured reference resistor impedance is in storage 15 (Yes in S14), impedance calculation unit 10 reads the reference resistor impedance from storage 15 and calculates the difference between the impedance that has been read and the calculated impedance of reference resistor 2 (S15).

Impedance calculation unit 10 then determines whether the calculated impedance difference falls within a threshold value (S16). When the calculated impedance difference does not fall within the threshold value (No in S16), impedance calculation unit 10 notifies an external device (not shown in the figure), such as a controller, of an error (S17), and ends the process.

When the calculated impedance difference falls within the threshold value (Yes in S16), impedance calculation unit 10 determines that impedance measurement has been performed normally and saves the calculated impedance of reference resistor 2 in storage 15 (S18). After that, impedance calculation unit 10 calculates the impedance of each of cells 1*a* to 1*e* from the AC voltage of each of cells 1*a* to 1*e* and the AC current that have been obtained in step S11 (S19).

Subsequently, calibration unit 11 (*i*) performs temperature correction on the known reference resistor impedance obtained from storage 15 via impedance calculation unit 10, using the measured temperature of reference resistor 2 obtained in step S12, (ii) calculates the gain error and phase error of the impedance of reference resistor 2 calculated by impedance calculation unit 10, using the known reference resistor impedance after temperature correction as a reference, and (iii) corrects the gain and phase of the calculated impedance of each of cells 1*a* to 1*e* using the gain error and the phase error (S20). Temperature correction is a process of converting known reference resistor impedance obtained from storage 15 via impedance calculation unit 10 into impedance at the temperature measured in step S12 by, for example, referencing a look-up table that is pre-stored.

When the impedance measurement and correction (steps S11 to S20) end, switch control unit 17 turns ON through switch 16 and short-circuits reference resistor 2 (S21).

Here, the detail of step S20 (impedance correction) described above is as follows.

Assuming that $Z_{ref}$ denotes known reference resistor impedance after temperature correction and $Z_{ref\_mea}$ denotes measured impedance of reference resistor 2, gain error $gain_{cor}$ and phase error $\theta_{cor}$ of the impedance of reference resistor 2 are respectively expressed by the following equations (1) and (2).

$$gain_{cor} = |Z_{ref}| / |Z_{ref\_mea}| \tag{1}$$

$$\Theta_{cor} = \arg Z_{ref} - \arg Z_{ref\_mea} \tag{2}$$

Here, argZ denotes the phase of impedance Z.

Accordingly, when Zcell_mea denotes the measured impedance of each of cells 1*a* to 1*e*, magnitude |Zcell_cor| and phase argZcell_cor of the corrected impedance Zcell_cor of each of cells 1*a* to 1*e* are respectively expressed by the following equations (3) and (4).

$$|Zcell\_cor| = gain_{cor} * |Zcell\_mea| \tag{3}$$

$$\arg Zcell\_cor = \arg Zcell\_mea + \Theta_{cor} \tag{4}$$

By performing the correction calculation described above, calibration unit 11 can correct the gain error that occurs between reference resistor 2 and shunt resistor 7 as well as the phase difference that occur in first transmission line 3 and second transmission line 6, and measure the impedance of each of cells 1*a* to 1*e* with accuracy.

Embodiment 2

Figure 6:
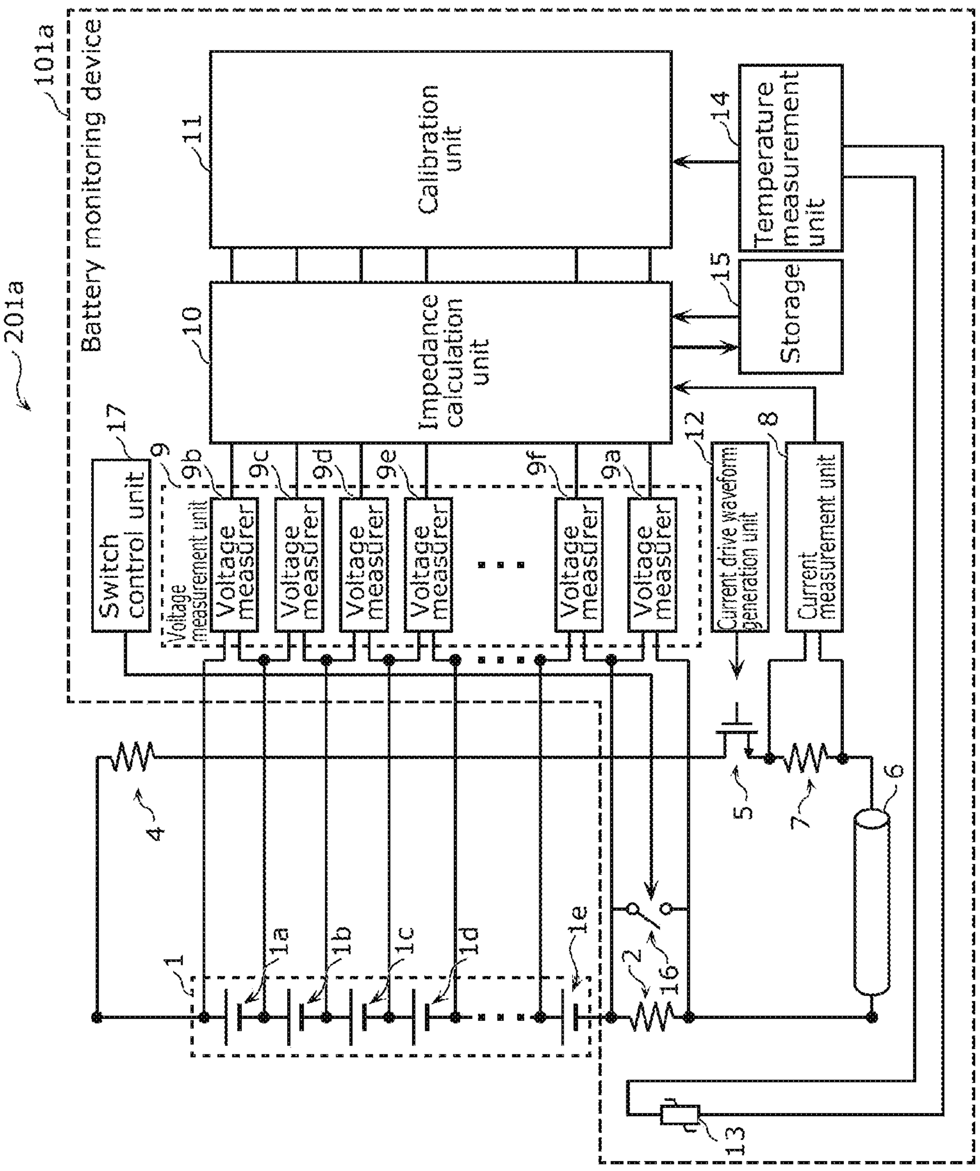
FIG. 6 is a block diagram illustrating the configuration of a battery monitoring system according to Embodiment 2.

FIG. 6 is a block diagram illustrating battery monitoring system 201*a* according to Embodiment 2. Battery monitoring system 201*a* according to the present embodiment basically has the same configuration as battery monitoring system 201 according to Embodiment 1, but has a different connection relationship of components compared with battery monitoring system 201 according to Embodiment 1.

More specifically, battery monitoring system 201*a* according to the present embodiment is different from battery monitoring system 201 according to Embodiment 1 in regard to the following: reference resistor 2 and through switch 16 are connected between second transmission line 6 and the negative terminal of cell 1*e* that is the lowest cell in cell stack 1; first transmission line 3 is removed and the positive terminal of cell 1*a* that is the highest cell in cell stack 1 is connected to load resistor 4 by a short line; and the location of thermistor 13 is also changed to be disposed in proximity to reference resistor 2 due to a change in the connection location of reference resistor 2. The "short line" means a short line such that the phase shift of a transmission signal, which occurs in that line, is small enough to be ignored in terms of impedance correction.

In battery monitoring system 201*a* according to the present embodiment, current that has flowed through cell stack 1 and reference resistor 2 flows to shunt resistor 7 via second transmission line 6. Therefore, the phase or the like of an AC current obtained using shunt resistor 7 is shifted from the phase of an AC current that flows through cell stack 1 and reference resistor 2. Thus, in the present embodiment, like Embodiment 1, the measured impedance of each of cells 1*a* to 1*e* needs to be corrected using, for instance, the impedance of reference resistor 2.

Battery monitoring device 101*a* according to the present embodiment has the same configuration as battery monitoring device 101 according to Embodiment 1, and the measured impedance of each of cells 1*a* to 1*e* is corrected using, for instance, reference resistor 2 in the same procedure as that used by battery monitoring device 101 according to Embodiment 1 which is illustrated in FIG. 5. Since the detail of the procedure is the same as the procedure illustrated in FIG. 5, description thereof is omitted.

By performing the same correction calculation as that performed by battery monitoring device 101 according to Embodiment 1, battery monitoring device 101*a* according to the present embodiment can correct the gain error that occurs between reference resistor 2 and shunt resistor 7 as well as the phase error that occurs in second transmission line 6, and measure the impedance of each of cells 1*a* to 1*e* with accuracy.

As described above, battery monitoring device 101 according to Embodiment 1 or battery monitoring device 101*a* according to Embodiment 2 monitors a battery, and includes: reference resistor 2 connected to the battery in series; a measurement calculation unit (voltage measurement unit 9, current measurement unit 8, and impedance calculation unit 10) configured to measure impedance of the battery and impedance of reference resistor 2; and calibration unit 11 configured to correct the gain and phase of the impedance of the battery that has been measured, using the impedance of reference resistor 2 that has been measured.

With the above configuration, since the gain and phase of the measured impedance of a battery are corrected using the impedance of reference resistor 2, a battery monitoring device capable of measuring the impedance of a battery with accuracy is achieved. Accordingly, battery degradation is detected with high accuracy and BMS reliability is enhanced.

The battery is cell stack 1 in which cells 1*a* to 1*e* are connected in series. The measurement calculation unit is configured to measure impedance of one of cells 1*a* to 1*e* or impedances of series cells into which cells 1*a* to 1*e* are divided. Calibration unit 11 is configured to correct the gain and the phase of the impedance of the one of cells 1*a* to 1*e* that has been measured or the impedances of the series cells that have been measured, using the impedance of reference resistor 2 that has been measured. With this, the impedance of at least one of cells 1*a* to 1*e* included in cell stack 1 is measured.

Battery monitoring device 101 or 101*a* further includes storage 15 that stores known reference resistor impedance serving as a reference. Calibration unit 11 is configured to: calculate a gain error and a phase error of the impedance of reference resistor 2 that has been measured, using the known reference resistor impedance as a reference; and correct the gain and the phase of the impedance of the battery that has been measured, using the gain error and the phase error. This enables highly accurate impedance correction using known reference resistor impedance as a reference.

Battery monitoring device 101 or 101*a* further includes: thermistor 13 for monitoring the temperature of reference resistor 2; and temperature measurement unit 14 configured to measure the temperature of reference resistor 2 using thermistor 13. After correcting the impedance of reference resistor 2 that has been measured, using the temperature of reference resistor 2 that has been measured, calibration unit 11 is configured to correct the gain and the phase of the impedance of the battery. With this, since a reference resistor is placed near a battery, the impedance of the battery is corrected in consideration of the battery or the temperature of an environment in which the battery is placed. This therefore enables impedance correction that is robust against temperature.

Battery monitoring device 101 or 101*a* further includes: through switch 16 connected to reference resistor 2 in parallel; and switch control unit 17 configured to short-circuit through switch 16 when the impedance of the battery is not measured. This can inhibit heat that may be generated from reference resistor 2 when the impedance of a battery is not measured.

The measurement calculation unit is configured to: further store impedance of reference resistor 2 previously measured in storage 15; and determine whether the impedance of reference resistor 2 that has been measured was correctly measured, based on the impedance stored in storage 15, to output a determination result. This inhibits a trouble such that impedance correction is performed in a state in which impedance measurement cannot be performed correctly due to, for instance, damages to reference resistor 2.

Reference resistor 2 is connected to the positive terminal of cell 1*a* that is the highest cell in cell stack 1 or the negative terminal of cell 1*e* that is the lowest cell in cell stack 1. With this, reference resistor 2 is provided near cell stack 1 and impedance measurement is performed under an environment similar to the environment of cell stack 1.

As described above, battery monitoring system 201 according to Embodiment 1 or battery monitoring system 201*a* according to Embodiment 2 includes: a battery; and battery monitoring device 101 or 101*a* that monitors the battery. With this, since the gain and phase of the measured impedance of a battery are corrected using the impedance of reference resistor 2, a battery monitoring system capable of measuring the impedance of a battery with accuracy is achieved. Accordingly, battery degradation is detected with high accuracy and BMS reliability is enhanced.

Although the battery monitoring device and the battery monitoring system according to the present disclosure have been described based on Embodiments 1 and 2, the present disclosure is not limited to these embodiments. Various modifications to the embodiments which may be conceived by those skilled in the art, as well as other forms resulting from combinations of one or more elements from different embodiments are also included within the scope of the present disclosure so long as they do not depart from the essence of the present disclosure.

For example, cell stack 1 is a monitoring target in Embodiments 1 and 2 described above, but a single cell may be targeted for monitoring. The same impedance measurement and correction as in Embodiments 1 and 2 can be performed.

Although first transmission line 3 and second transmission line 6 are inserted in a current loop through which current from cell stack 1 flows in Embodiment 1 described above, second transmission line 6 need not be inserted (i.e., a short line may be inserted instead of second transmission line 6). Even in such a case, the impedance measurement and correction illustrated in FIG. 5 are effective since a gain error and a phase error may occur due to first transmission line 3 between (i) cells 1*a* to 1*e* and reference resistor 2 and (ii) shunt resistor 7.

The present disclosure may be realized as a battery monitoring method including the procedure illustrated in FIG. 5. In other words, the battery monitoring method is a method for monitoring a battery and includes: a measurement calculation step of measuring the impedance of a battery and the impedance of a reference resistor connected to the battery in series; and a calibration step of correcting the gain and phase of the measured impedance of the battery using the measured impedance of the reference resistor.

Moreover, the present disclosure may be realized as a program causing a computer to execute the steps included in such a battery monitoring method, or as a computer-readable recording medium, such as a DVD, on which the program is recorded.

INDUSTRIAL APPLICABILITY

The battery monitoring device and the battery monitoring system according to the present disclosure can be utilized as a battery monitoring device and a battery management system (BMS) that monitor a battery such as a cell stack in which cells such as lithium-ion cells are connected in series, and particularly utilized as a battery monitoring device that can measure the impedance of a battery with accuracy, e.g., as a battery monitoring device that monitors storage batteries for stably supplying renewable energy as well as environment-friendly vehicles including electric vehicles.

The invention claimed is:

1. A battery monitoring device that monitors a battery, the battery monitoring device comprising:

a reference resistor connected to the battery in series;

a measurement calculation unit configured to measure impedance of the battery and impedance of the reference resistor; and a calibration unit configured to correct a gain and a phase of the impedance of the battery that has been measured, using the impedance of the reference resistor that has been measured.

2. The battery monitoring device according to claim 1, wherein the battery is a cell stack in which cells are connected in series, the measurement calculation unit is configured to measure impedance of one of the cells or impedances of series cells into which the cells are divided, and the calibration unit is configured to correct the gain and the phase of the impedance of the one of the cells that has been measured or the impedances of the series cells that have been measured, using the impedance of the reference resistor that has been measured.

3. The battery monitoring device according to claim 2, wherein the reference resistor is connected to a positive terminal of a highest cell in the cell stack or a negative terminal of a lowest cell in the cell stack.

4. The battery monitoring device according to claim 1, further comprising:

a storage that stores known reference resistor impedance serving as a reference, wherein the calibration unit is configured to: calculate a gain error and a phase error of the impedance of the reference resistor that has been measured, using the known reference resistor impedance as a reference; and correct the gain and the phase of the impedance of the battery that has been measured, using the gain error and the phase error.

5. The battery monitoring device according to claim 3, wherein the measurement calculation unit is configured to: further store impedance of the reference resistor previously measured in the storage; and determine whether the impedance of the reference resistor that has been measured was correctly measured, based on the impedance stored in the storage, to output a determination result.

6. The battery monitoring device according to claim 1, further comprising:

a thermistor for monitoring a temperature of the reference resistor; and a temperature measurement unit configured to measure the temperature of the reference resistor using the thermistor, wherein after correcting the impedance of the reference resistor that has been measured, using the temperature of the reference resistor that has been measured, the calibration unit is configured to correct the gain and the phase of the impedance of the battery.

7. The battery monitoring device according to claim 1, further comprising:

a through switch connected to the reference resistor in parallel; and a switch control unit configured to short-circuit the through switch when the impedance of the battery is not measured.

8. A battery monitoring system comprising:

a battery; and the battery monitoring device according to claim 1 that monitors the battery.

* * * * *